United States Patent
Suezaki et al.

(10) Patent No.: US 10,410,907 B2
(45) Date of Patent: Sep. 10, 2019

(54) SAMPLE-HOLDING DEVICE, METHOD FOR MANUFACTURING SOLAR CELL, AND METHOD FOR MANUFACTURING SOLAR CELL MODULE

(71) Applicant: Kaneka Corporation, Osaka (JP)

(72) Inventors: Takashi Suezaki, Toyooka (JP); Ryota Mishima, Settsu (JP)

(73) Assignee: KANEKA CORPORATION, Osaka (JP)

(*) Notice: Subject to any disclaimer, the term of this patent is extended or adjusted under 35 U.S.C. 154(b) by 58 days.

(21) Appl. No.: 15/472,811

(22) Filed: Mar. 29, 2017

(65) Prior Publication Data

US 2017/0200631 A1    Jul. 13, 2017

Related U.S. Application Data

(63) Continuation of application No. PCT/JP2015/077762, filed on Sep. 30, 2015.

(30) Foreign Application Priority Data

Sep. 30, 2014    (JP) .................................. 2014-202572

(51) Int. Cl.
*H01L 21/683* (2006.01)
*H01L 31/0203* (2014.01)
(Continued)

(52) U.S. Cl.
CPC .... *H01L 21/6838* (2013.01); *H01L 21/68735* (2013.01); *H01L 31/0203* (2013.01); *H01L 31/1884* (2013.01)

(58) Field of Classification Search
CPC ............... H01L 21/6838; H01L 21/68735
See application file for complete search history.

(56) References Cited

U.S. PATENT DOCUMENTS 7,055,875 B2*   6/2006  Bonora ............... H01L 21/6838
                                                        294/188
2013/0234194 A1*  9/2013  Ryu ..................... B65G 47/911
                                                        257/99

FOREIGN PATENT DOCUMENTS

JP    H09-129587 A    5/1997
JP    2001180822 A    7/2001
(Continued)

OTHER PUBLICATIONS

International Preliminary Report on Patentability issued in International Application No. PCT/JP2015/077762 dated Apr. 4, 2017 (15 pages).

(Continued)

*Primary Examiner* — Tuan A Hoang
(74) *Attorney, Agent, or Firm* — Osha Liang LLP

(57) ABSTRACT

A sample-holding device for holding and lifting a sample includes a sample-holding surface facing the sample; and a positioning member provided at a peripheral part of the sample-holding surface, the positioning member comprising a contact part having an outward-facing part on a back side thereof; a first rounded or chamfered end; and a second rounded or chamfered end, wherein the contact part contacts with part of the sample when the sample is held or when the sample is off-point, wherein the first end is an end of a section comprising the contact part or a part smoothly continuing from the contact part, the end being on a distant side from the sample-holding surface, and the second end is an end of the outward-facing part, the end being located on a tipping side of the outward-facing part.

19 Claims, 12 Drawing Sheets

(51) Int. Cl.
*H01L 31/18* (2006.01)
*H01L 21/687* (2006.01)

(56) References Cited

FOREIGN PATENT DOCUMENTS

| | | | | |
|---|---|---|---|---|
| JP | 2004253480 A | 9/2004 | | |
| JP | 2011057314 A | 3/2011 | | |
| JP | 2011060849 A | 3/2011 | | |
| WO | WO-9716847 A1 * | 5/1997 | ......... | H01L 21/6838 |

OTHER PUBLICATIONS

International Search Report issued in International Applicatoin No. PCT/JP2015/077762; dated Dec. 28, 2015 (2 pages).

* cited by examiner

US 10,410,907 B2

SAMPLE-HOLDING DEVICE, METHOD FOR MANUFACTURING SOLAR CELL, AND METHOD FOR MANUFACTURING SOLAR CELL MODULE

TECHNICAL FIELD

One or more embodiments of the present invention relate to a sample-holding device using the Bernoulli effect. In addition, one or more embodiments of the present invention relate to a method for manufacturing a solar cell. Furthermore, one or more embodiments of the present invention relate to a method for manufacturing a solar cell module.

BACKGROUND ART

In the manufacturing process of an industrial product, there are many processes of lifting a sample such as a workpiece or raw material or transferring the sample between devices. In a case of lifting the sample or transferring the sample between devices, it is necessary to grab the sample, and a sample-holding device is provided as a device for grabbing the sample.

Examples of a known sample-holding device include a device of a type of physically sandwiching a sample with a manipulator, a magnetic chuck using a magnetic force, a vacuum pad using vacuum, and a Bernoulli chuck using the Bernoulli effect. The Bernoulli chuck is suitable for holding and lifting a thin and smooth sample such as a sheet or a substrate. In addition, since the Bernoulli chuck can hold the sample in a noncontact manner in theory, the Bernoulli chuck does not have negative effects such as attaching an oil film or dirt to the surface of a sample, and making the surface irregular. Therefore, the sample held by the Bernoulli chuck is less damaged by being held. Thus, the Bernoulli chuck is preferably used in a case where a sputtering process or a plating process is included in the subsequent processes.

In contrast, the Bernoulli chuck is disadvantageous in that the suction force of the Bernoulli chuck is less than that of the vacuum pad or the like, and the holding force in a planar direction is particularly weak. That is, the Bernoulli chuck includes a sample-holding surface facing a sample to be held, generates negative pressure by flowing a gas between the sample-holding surface and the sample, and sucks the sample on a sample-holding surface side due to difference in pressure from atmospheric pressure. In the Bernoulli chuck, an air flow is necessary between the sample-holding surface and the sample, a space through which air passes needs to exist between the sample-holding surface and the sample, and the entire surface of the sample cannot be pressed against the sample-holding surface. In addition, it is difficult to create an engagement part preventing movement of the sample in the planar direction, in the space between the sample-holding surface and the sample.

In view of the foregoing, Patent Document 1 proposes a Bernoulli chuck including a positioning member provided on a peripheral surface of a sample-holding surface. In a Bernoulli chuck 300 disclosed in Patent Document 1, positioning members 301 are disposed on the peripheral surface of a sample-holding surface 302 at intervals from each other as illustrated in FIG. 15. The positioning member 301 disclosed in Patent Document 1 is triangular in cross section as illustrated in FIG. 15, and includes an inclined surface. The positioning member 301 disclosed in Patent Document 1 includes a sharp front end 303. Note that the Bernoulli chuck 300 disclosed in Patent Document 1 holds and rotates a sample 305, and does not lift the sample 305. Therefore, the sample-holding surface 302 is directed upward and the positioning member 301 is also provided upward.

PRIOR ART DOCUMENT

Patent Document

Patent Document 1: JP H9-129587 A

As described above, since a Bernoulli chuck can suck and hold a semiconductor substrate in a noncontact manner, it is expected that the Bernoulli chuck will not impart a scratch to the surface of the semiconductor substrate, will not cause adhesion of an oil film or dirt to the surface, and will not make the surface irregular. However, when a Bernoulli chuck was manufactured by way of trial at a prototype plant of the present applicant, a semiconductor substrate was lifted and transferred by the Bernoulli chuck from one device to another device in the subsequent process, and thus solar cells were mass-produced by way of trial, a micro scratch was generated on some of the solar cells. The scratches were not visible in solar cells in-process. However, the scratches are visible in finished solar cells.

As a result of investigation, the scratch was generated by the positioning member 301 bumping the semiconductor substrate of a sample while the semiconductor substrate was sucked by the Bernoulli chuck. A description will be given below. The shape of a Bernoulli chuck 200 that the present inventors manufactured by way of comparison is generally as illustrated in FIG. 13. In the Bernoulli chuck 200 that the present inventors manufactured for comparative purposes, positioning members 202 are arranged on the circumference of a sample-holding surface 201 as illustrated in FIG. 13 in order to prevent movement of the sample in the planar direction when a semiconductor substrate (specifically, a crystal silicon substrate) 10 is held by the Bernoulli chuck. The shape of the positioning member 202 is determined with reference to the structure disclosed in Patent Document 1. That is, even though the Bernoulli chuck 300 disclosed in Patent Document 1 does not lift a sample and an intended use of the Bernoulli chuck 300 differs from an intended use of the Bernoulli chuck 200, the positioning member 202 of the present prototype is designed with reference to the Bernoulli chuck 300.

The cross-sectional shape of an effective portion M of the positioning member 202 is a pentagon as illustrated in an enlarged view in FIG. 13. The positioning member 202 is a three-dimensional member, and the effective portion M projecting downward below the sample-holding surface 201 includes an inward-facing surface A, an outward-facing surface B, a downward-facing surface C, and side surfaces D, as illustrated in FIGS. 13 and 14. The inward-facing surface A is a surface facing the inner side (sample-holding surface 201 side). The outward-facing surface B is a surface constituting the back side of the inward-facing surface A, and facing the outer side (side opposite to the sample-holding surface 201). The downward-facing surface C is a surface connecting the inward-facing surface A and the outward-facing surface B and extending in parallel to the sample-holding surface 201. The side surface D is a surface connecting the inward-facing surface A, the outward-facing surface B, and the downward-facing surface C and extending in the direction vertically crossing the sample-holding surface 201. The inward-facing surface A is composed of an inclined contact surface Aa with which a side of the semiconductor substrate 10 is brought into contact, and a space-forming wall surface Ab connecting a side part of the sample-holding surface 201 and the contact surface Aa. The space-forming wall surface Ab is a plane vertical to the sample-holding surface 201 and different from the contact surface Aa. Therefore, to be more accurate, the effective portion M of the positioning member 202 is surrounded by the contact surface Aa, the space-forming wall surface Ab, the outward-facing surface B, the downward-facing surface C, and the side surfaces D.

Therefore, a portion where adjacent two surfaces are in contact with each other becomes a ridge. In the positioning member 202 of the prototype, the following six types of ridges exist:
(1) a ridge Aa-Ab where the contact surface Aa and the space-forming wall surface Ab are in contact with each other;
(2) a ridge Aa-C where the contact surface Aa and the downward-facing surface C are in contact with each other;
(3) a ridge B-C where the outward-facing surface B and the downward-facing surface C are in contact with each other;
(4) two ridges A-D at each of which the inward-facing surface A and the side surface D are in contact with each other;
(5) two ridges B-D at each of which the outward-facing surface B and the side surface D are in contact with each other; and
(6) two ridges C-D at each of which the downward-facing surface C and the side surface D are in contact with each other.

Note that since the space-forming wall surface Ab and the contact surface Aa are different planes, the two ridges A-D at each of which the inward-facing surface A and the side surface D are in contact with each other are bent. Therefore, to be accurate, the ridge A-D is divided into a ridge Ab-D where the space-forming wall surface Ab and the side surface D are in contact with each other, and a ridge Aa-D where the contact surface Aa and the side surface D are in contact with each other.

In addition, there is a corner where three surfaces are in contact with one another. In the positioning member 202 of the prototype, there are the following three corners:
(7) two corners Aa-C-D each formed by the contact surface Aa, the downward-facing surface C, and the side surface D;
(8) two corners B-C-D each formed by the outward-facing surface B, the downward-facing surface C, and the side surface D; and
(9) two corners Aa-Ab-D each formed by the contact surface Aa, the space-forming wall surface Ab, and the side surface D.

In the positioning member 202 manufactured by way of trial, all of the six types of ridges and the three types of corners are sharp. That is, the contact surface Aa and the space-forming wall surface Ab are not smoothly connected to each other. The ridge Aa-Ab between the contact surface Aa and the space-forming wall surface Ab is angular. In other words, the end of a contact part (contact surface Aa) on the sample-holding surface Ab side is angular.

In addition, the ridge Aa-C between the contact surface Aa and the downward-facing surface C is angular. In other words, the end (ridge Aa-C) of the contact part (contact surface Aa) on the farther side from the sample-holding surface 201 is angular.

In addition, the ridge B-C where the outward-facing surface B and the downward-facing surface C are in contact with each other is angular. In other words, the end (ridge B-C) of the outward-facing surface B on the farther side from the sample-holding surface 201 is angular. In yet other words, the end (ridge B-C) of the outward-facing surface B on the front-end side is angular.

Furthermore, the two ridges A-D at each of which the inward-facing surface A and each side surface D are in contact with each other are angular. In other words, a corner part (ridge A-D) configured by the inward-facing surface A and the side surface D is angular.

In addition, the two ridges B-D at each of which the outward-facing surface B and the side surface D are in contact with each other are angular. In other words, a corner part (ridge B-D) configured by the outward-facing surface B and the side surface D is angular.

In addition, the ridge C-D where the downward-facing surface C and the side surface D are in contact with each other is angular. In other words, a corner part (ridge C-D) configured by the downward-facing surface C and the side surface D is angular.

In addition, the corner Aa-C-D formed by the contact surface Aa, the downward-facing surface C, and the side surface D is angular. In other words, a corner part (corner Aa-C-D) configured by the contact surface Aa, the downward-facing surface C, and the side surface D is angular.

In addition, the corner B-C-D formed by the outward-facing surface B, the downward-facing surface C, and the side surface D is angular. In other words, a corner part (corner B-C-D) configured by the outward-facing surface B, the downward-facing surface C, and the side surface D is angular.

In addition, the corner Aa-Ab-D formed by the contact surface Aa, the space-forming wall surface Ab, and the side surface D is angular. In other words, a crossing part (corner Aa-Ab-D) where the ridge Aa-Ab and the side surface D cross each other is angular.

That is, the positioning member 202 manufactured by way of trial by the present inventors is three-dimensional surrounded by different planes. However, none of the adjacent planes are smoothly connected to each other. A joint part between planes is angular.

When the semiconductor substrate 10 is held by the Bernoulli chuck 200, the Bernoulli chuck 200 is brought close to the semiconductor substrate 10 by a robot or the like, air is made to flow from a center hole 223, an air flow is formed between the semiconductor substrate 10 and the sample-holding surface 201, the pressure in the space between them is made negative, and thus the semiconductor substrate 10 is sucked toward the sample-holding surface 201 side. Here, when the Bernoulli chuck 200 is brought close to the semiconductor substrate 10, the Bernoulli chuck 200 and the semiconductor substrate 10 should be brought into a state where the center of the semiconductor substrate 10 and the center of the sample-holding surface 201 are aligned with each other, and the X-axis and the Y-axis of the semiconductor substrate 10 are aligned with the x-axis and the y-axis of the sample-holding surface 201, respectively (see FIG. 1). However, these may be shifted from each other to some extent. Therefore, the semiconductor substrate 10 may be brought into contact with a portion other than the inclined contact surface Aa of the positioning member 202 when the semiconductor substrate 10 is sucked toward the sample-holding surface 201 side.

In addition, even though the central axis, the X-axis, and the Y-axis of the semiconductor substrate 10 are aligned with those of the positioning member 202, the semiconductor substrate 10 may be inclined when the semiconductor substrate 10 floats up, and the semiconductor substrate 10 may be brought into contact with a portion other than the contact surface Aa of the positioning member 202. When the semiconductor substrate 10 is brought into contact with an angular portion other than contact surface Aa of the positioning member 202, the semiconductor substrate 10 is rubbed and slightly damaged, which causes failure in the subsequent processes. There is a tendency that the semiconductor substrate 10 is greatly damaged when the semiconductor substrate 10 is held by the Bernoulli chuck 200 in a case where the semiconductor substrate 10 is large and thin to some extent. That is, the semiconductor substrate 10 is likely to warp in a case where the semiconductor substrate 10 is large and thin to some extent. In a case where the semiconductor substrate 10 warps, the semiconductor substrate 10 is less likely to escape from the angular portion when the semiconductor substrate 10 hits the angular portion, and the damaged area tends to be greater. This tendency is evident especially in a case where a crystal silicon substrate is used. When the semiconductor substrate 10 hits the angular portion, the semiconductor substrate 10 is less likely to escape from the angular portion and the damaged area is likely to be greater. For example, in a heterojunction solar cell, which is a solar cell including a crystal silicon substrate with a heterojunction and produced in a low-temperature process not exceeding 200 degrees Celsius, since a damage mitigation effect in a heating process cannot be expected much, a semiconductor substrate is greatly damaged when the semiconductor substrate is held by the Bernoulli chuck 200.

One or more embodiments of the present invention provide a sample-holding device not damaging a sample such as the semiconductor substrate 10. In addition, one or more embodiments of the present invention provide a method for manufacturing a solar cell by using the sample-holding device and a method for manufacturing a solar cell module.

SUMMARY

One or more embodiments of the present invention relate to a sample-holding device for holding and lifting a sample, the sample being a solar cell in process having a semiconductor substrate, the sample-holding device including: a sample-holding surface facing the sample; and a positioning member provided at a peripheral part of the sample-holding surface, the positioning member preventing the sample from moving in a planar direction of the sample-holding surface, the positioning member including a contact part that contacts with part of the sample when the sample is held or when the sample is off-point, the contact part provided with an outward-facing part on a back side thereof, wherein the sample-holding device generates negative pressure by making a gas flow between the sample-holding surface and the sample to suck the sample toward the sample-holding surface by the negative pressure, thus holding the sample at a position in proximity to the sample-holding surface, and wherein the sample-holding device includes a first rounded or chamfered end and a second rounded or chamfered end,
(1) the first end being defined as an end of a section including the contact part and a smoothly continuing part from the contact part, the end being on a distant side from the sample-holding surface,
(2) the second end being defined as an end of the outward-facing part, the end being located on a tipping side of the outward-facing part.
Note that "the second end being defined as an end of the outward-facing part, the end being located on a tipping side of the outward-facing part" is an "end of an outward-facing part provided on the back side of the contact part, on the farther side from the sample-holding surface".

One or more embodiments of the present invention relate to a sample-holding device for holding and lifting a sample, the sample being a solar cell in process having a semiconductor substrate, the sample-holding device including: a sample-holding surface facing the sample; and a positioning member provided at a peripheral part of the sample-holding surface, the positioning member preventing the sample from moving in a planar direction of the sample-holding surface, the positioning member including a contact part that contacts with part of the sample when the sample is held or when the sample is off-point, the contact part provided with an outward-facing part on a back side thereof, wherein the sample-holding device generates negative pressure by making a gas flow between the sample-holding surface and the sample to suck the sample toward the sample-holding surface by the negative pressure, thus holding the sample at a position in proximity to the sample-holding surface, wherein the sample-holding device further includes: a downward-facing part crossing a section including the contact part and a smoothly continuing part from the contact part and extending in a direction parallel to or inclined with respect to the sample-holding surface; a side part crossing the section including the contact part and the smoothly continuing part from the contact part and extending in a direction crossing the sample-holding surface; and a ridge defined as an end of the section including the contact part and the smoothly continuing part from the contact part, the end of the section being on a side of the sample-holding surface, and wherein the sample-holding device includes a first end, a second end, a third end, a first corner, a second corner, a third corner, a forth corner, a fifth corner, and a crossing part, any of the ends, the corners, and the crossing part being rounded or chamfered,
(1) the third end being defined as an end of the section including the contact part and the smoothly continuing part from the contact part, the end being on a side of the sample-holding surface,
(2) the first end being defined as an end of the section including the contact part and the smoothly continuing part from the contact part, the end of the section being on a distant side from the sample-holding surface,
(3) the second end being defined as an end of the outward-facing part, the end being located on a tipping side of the outward-facing part,
(4) the third corner part being configured by the side part and the section including the contact part and the smoothly continuing part, (5) the forth corner part being configured by the outward-facing part and the side part,
(6) the fifth corner part being configured by the downward-facing part and the side part,
(7) the first corner part being configured by the downward-facing part, the side part, and the section including the contact part and the smoothly continuing part,
(8) the second corner part being configured by the outward-facing part, the downward-facing part, and the side part,
(9) the crossing part being defined as a part where the ridge and the side part cross each other.

Here, "the "solar cell in-process including a semiconductor substrate" refers to a concept including "a semiconductor substrate itself such as a silicon wafer or the like, a semiconductor substrate such as a silicon wafer including a solar cell in-process, a semiconductor substrate including some layers laminated thereon, and a semiconductor substrate of a solar cell in process having some layers thereon". Note that it is possible to adopt a configuration according to one or more embodiments of the present invention in a case where a crystal silicon is used as the semiconductor substrate because a breakage is likely to occur in that case. A crystal silicon is used in a crystalline solar cell (diffusion type) and a heterojunction solar cell. It is possible to adopt one or more embodiments of the present invention for the heterojunction solar cell because the heterojunction solar cell is more sensitive to impact due to a silicon-based thin film layer formed in the heterojunction solar cell. That is, in a heterojunction solar cell, which is a solar cell including a crystal silicon substrate with a heterojunction and is produced in a low-temperature process not exceeding 200 degrees Celsius, a damage mitigation effect in a heating process cannot be expected much. As described above, since damage caused when the semiconductor substrate is held by the Bernoulli chuck is likely to remain in the heterojunction solar cell, it is possible to adopt one or more embodiments of the present invention. In the above-described aspect, a section which a sample is likely to be brought into contact with is rounded or chamfered. Therefore, even when the sample is brought into contact, the sample is not damaged.

The positioning member may be three-dimensional and may have a contact surface constituting the contact part.

According to one or more embodiments of the present invention, the sample and the positioning member are brought into line contact with each other, and a force is not locally applied to the sample.

The contact part may be an inclined surface inclined toward the sample-holding surface side.

In one or more embodiments of the present invention, since the contact part is the inclined surface inclined toward the sample-holding surface side, the sample and the sample-holding surface are kept parallel to each other when the sample is sucked toward the sample-holding surface side.

The contact part may be made of a material whose dynamic friction coefficient is less than 0.2.

Since the dynamic friction coefficient of the contact part is small in the sample-holding device according to one or more embodiments of the present invention, the sample is not damaged even when the sample is brought into contact and rubbed with the contact part.

The sample to be held may be a silicon substrate having a thickness ranging from 50 μm to 200 μm.

In a case where the thickness of the silicon substrate ranges from 50 μm to 200 μm, the silicon substrate is likely to warp, and is likely to be damaged when the silicon substrate is brought into contact with the positioning member. However, in the sample-holding device according to one or more embodiments of the present invention, even though the silicon substrate has the thickness ranging from 50 μm to 200 μm, the silicon substrate is less likely to be damaged by the positioning member brought into contact with the silicon substrate when the silicon substrate is held. The thickness of the silicon substrate may range from 50 μm to 170 μm, and the thickness may also range from 50 μm to 150 μm.

The sample-holding device further may include: a downward-facing part crossing the section including the contact part and the smoothly continuing part from the contact part and extending in a direction parallel to or inclined with respect to the sample-holding surface; and a side part crossing the section including the contact part and the smoothly continuing part from the contact part and extending in a direction crossing the sample-holding surface, and the sample-holding device may include a first rounded or chamfered corner part and a second rounded or chamfered corner part, (1) the first corner part being configured by the downward-facing part, the side part, and the section including the contact part and the smoothly continuing part, (2) the second corner part being configured by the outward-facing part, the downward-facing part, and the side part.

The sample-holding device further may include a side part crossing the section including the contact part and the smoothly continuing part from the contact part and extending in a direction crossing the sample-holding surface, and the sample-holding device may include a third rounded or chamfered corner part and a forth rounded or chamfered corner part, (1) the third corner part being configured by the side part and the section including the contact part and the smoothly continuing part, (2) the forth corner part being configured by the outward-facing part and the side part.

An aspect regarding a method for manufacturing a solar cell is a method for manufacturing a solar cell including a semiconductor substrate, the method including a substrate holding process using the sample-holding device described above, the substrate holding process holding a solar cell substrate in-process, the solar cell substrate in-process being a solar cell in-process.

According to one or more embodiments of the present invention, the yield of solar cell panels improves.

A process of forming a transparent conductive film on the substrate may be performed after the substrate holding process.

From the experience of the present inventors, failure is likely to occur in the process of forming a transparent conductive film. Judging from the experience, it is possible to use the sample-holding device according to one or more embodiments of the present invention in a case where there is the substrate-holding process before the process of forming the transparent conductive film. Furthermore, when plating is performed after the process of forming the transparent conductive film, plating is deposited on a non-desired portion if there is a scratch. However, in a case where plating is performed after the processes according to one or more embodiments of the present invention, deposition of plating on a non-desired portion can be suppressed.

In a method for manufacturing a solar cell module that includes a solar cell sealed with a sealing material, the solar cell may be manufactured by the method described above.

The sample-holding device according to one or more embodiments of the present invention is advantageous in that the sample is less damaged by the device. In addition, according to one or more embodiments of the method for manufacturing a solar cell of the present invention, the yield of solar cells improves. According to one or more embodiments of the method for manufacturing a solar cell module of the present invention, the yield of solar cell modules improves.

BRIEF DESCRIPTION OF DRAWINGS

FIGS. 3A to 3C are perspective views of a positioning member of the sample-holding device illustrated in FIG. 1, wherein FIGS. 3A, 3B, and 3C are viewed from different angles.

FIGS. 10A to 10C are explanatory views of manufacturing processes when the solar cell illustrated in FIG. 9 is manufactured, wherein FIG. 10A is a cross-sectional view after each silicon layer is formed, FIG. 10B is a cross-sectional view after each transparent electrode layer is formed, and FIG. 10C is a cross-sectional view after a base electrode layer is formed.

FIGS. 14A to 14C are perspective views of a positioning member of the sample-holding device illustrated in FIG. 13, wherein FIGS. 14A, 14B, 14C are viewed from different angles.

DETAILED DESCRIPTION OF EMBODIMENTS

Figure 1:
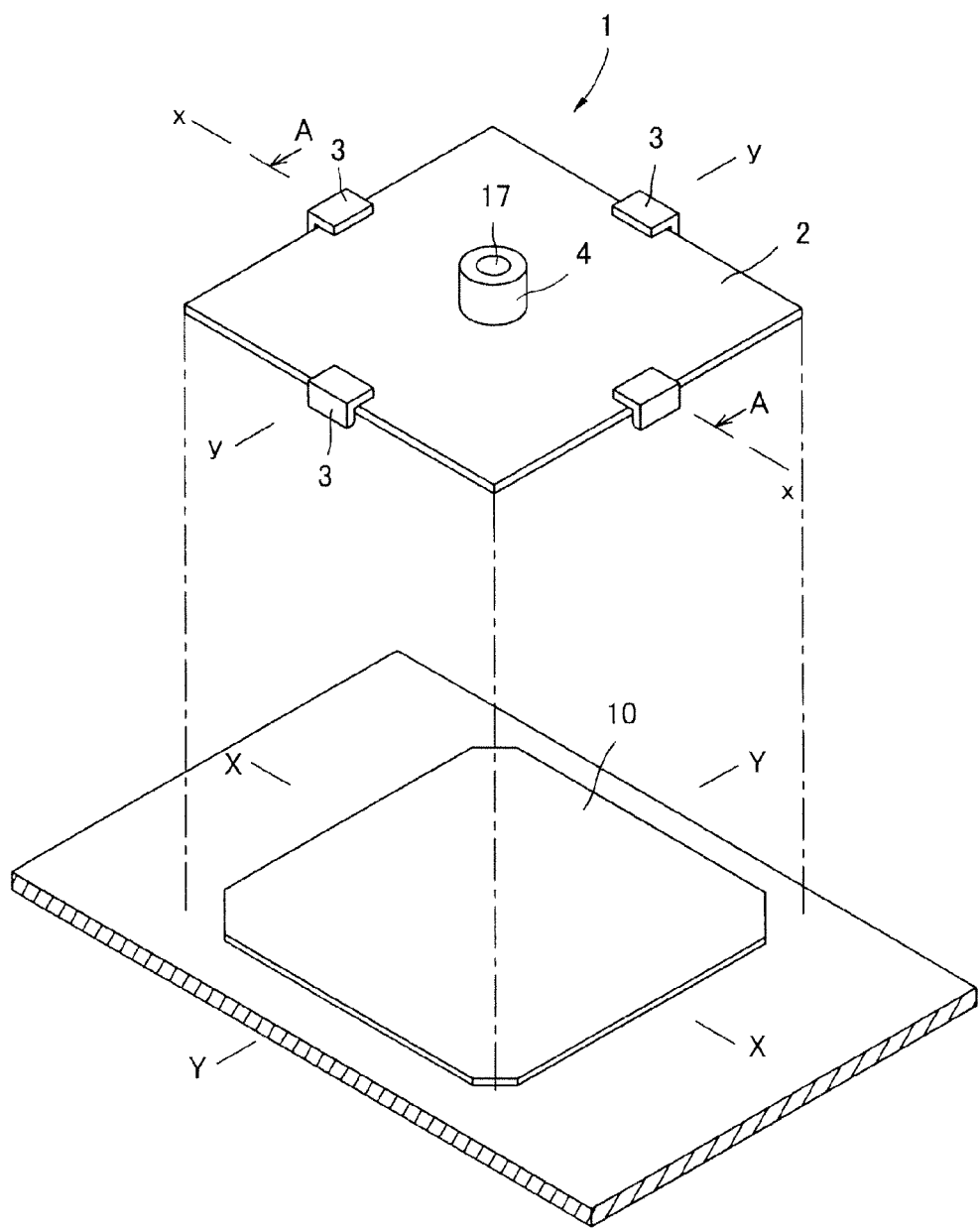
FIG. 1 is a perspective view of a sample-holding device according to one or more embodiments of the present invention and a semiconductor substrate which is a sample.
Figure 2:
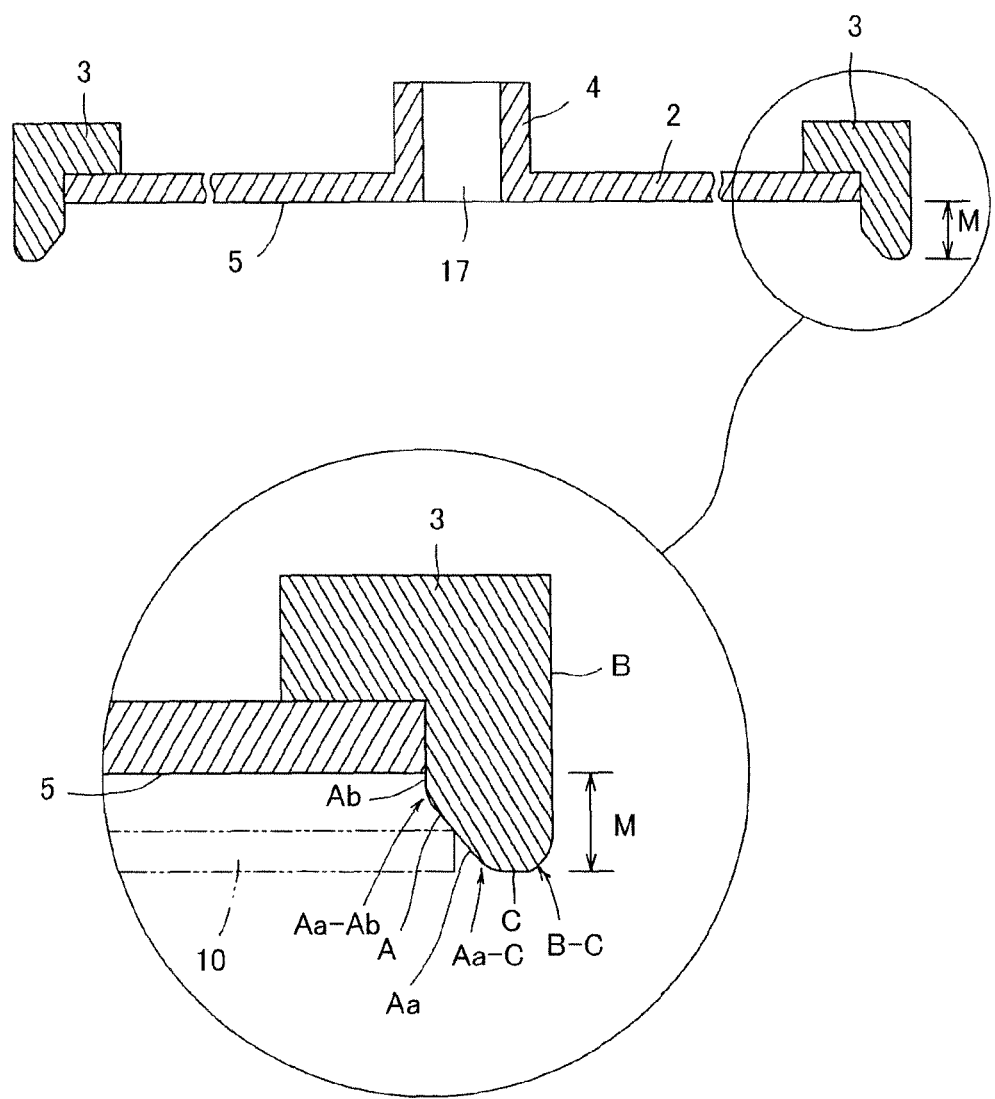
FIG. 2 is a cross-sectional view taken along A-A in FIG. 1 and a partially enlarged view of the cross-sectional view.
Figure 3A:
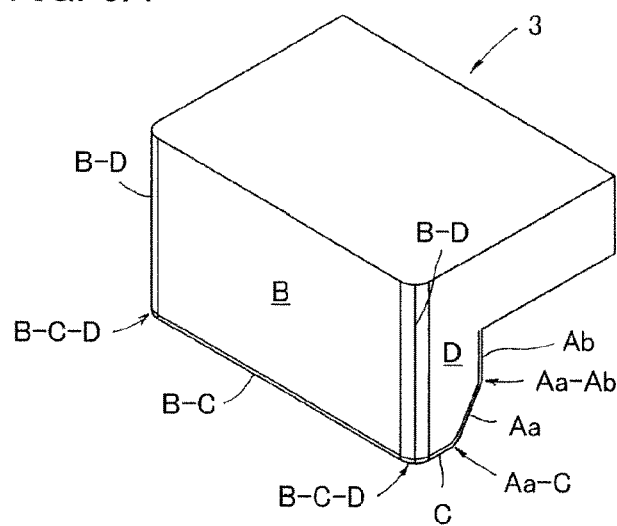
Figure 3B:
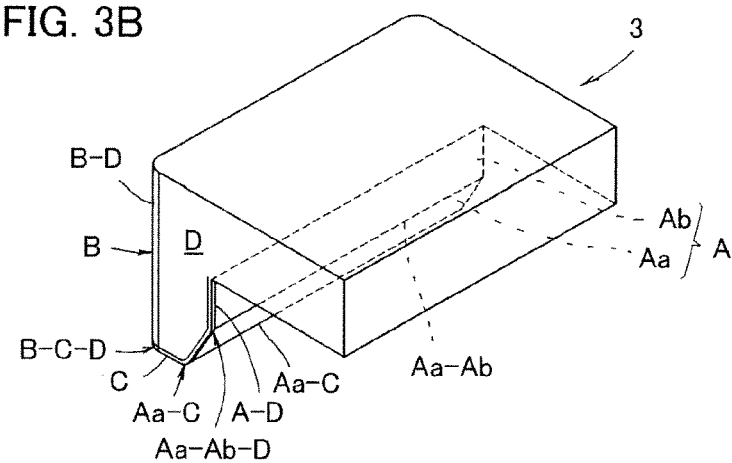
Figure 3C:
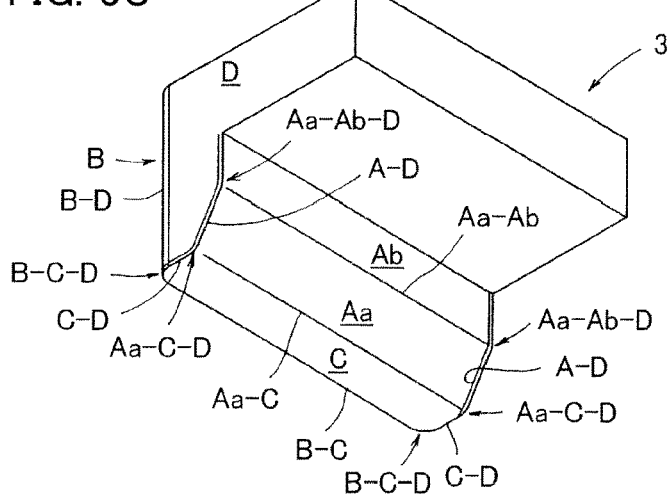

Hereinafter, one or more embodiments of the present invention will be described. Note that the present invention is not limited to the following embodiments. A sample-holding device 1 according to one or more embodiments of the present invention is a Bernoulli chuck, and is configured of a main body 2 and positioning members 3. The main body 2 is an approximately square plate, and an air introduction pipe 4 is connected to the center of the main body 2. In the same manner as in a known Bernoulli chuck, as illustrated in FIG. 2, the air introduction pipe 4 passes from the upper side to the lower side in the figure. The lower side of the main body 2 in the figure is a flat surface and functions as a sample-holding surface 5. The area of the sample-holding surface 5 is slightly smaller than the area of the semiconductor substrate 10, which is a sample. Note that the semiconductor substrate 10 is a solar cell in-process. The semiconductor substrate 10 has the thickness ranging from 50 μm to 200 μm, and warps when the semiconductor substrate 10 receives an external force. In a case where at least one side of the substrate 10 is textured, the thickness is measured by using the projecting end of the texture as a reference.

In one or more embodiments of the present invention, one positioning member 3 is provided on each side of the main body 2. The positioning member 3 is made of resin whose friction coefficient is less than 0.2. Representative examples of the material of the positioning member 3 include polytetrafluoroethylene resin (PTFE), tetrafluoroethylene-perfluoroalkyl vinyl ether copolymer resin (PFA), ultra-high-molecular-weight polyethylene resin (UHMWPE), hard polyethylene resin (PE), and polyacetal resin (POM). The most recommended material is polytetrafluoroethylene resin (PTFE) having a smaller friction coefficient. The shape of the positioning member 3 is roughly the same as the positioning member 202 of the above-described prototype. Therefore, the same sections are denoted by the same reference numerals. The positioning member 3 according to one or more embodiments of the present invention differs from the positioning member 202 of the prototype in that the positioning member 3 does not have an angular portion. That is, in the positioning member 3 adopted in one or more embodiments of the present invention, all the corner parts and portions where surfaces are in contact with each other are rounded.

More specifically, a rounded corner with radius of 2 mm or greater is provided. A rounded corner with radius of 5 mm or greater may be used; however, the effect of the invention can be expected when the radius is 1 mm or greater.

That is, the positioning member 3 is three-dimensional, and as illustrated in FIG. 2, an effective portion projecting downward below the sample-holding surface 5 is surrounded by an inward-facing surface A facing the inner side (sample-holding surface 5 side), an outward-facing surface B facing the outer side (side opposite to the sample-holding surface 5), a downward-facing surface C connecting the inward-facing surface A and the outward-facing surface B and extending in parallel to the sample-holding surface 5, and side surfaces D connecting the inward-facing surface A, the outward-facing surface B, and the downward-facing surface C. The outward-facing surface B is located at the back side relative to the inward-facing surface (including a contact part) A. The cross-sectional shape of the effective portion M of the positioning member 3 is a pentagon as illustrated in the enlarged view in FIG. 2.

The inward-facing surface A is configured of an inclined surface Aa and a space-forming wall surface Ab. The space-forming wall surface Ab is a plane connecting the inclined surface Aa and a side part of the sample-holding surface 5. The inclination direction of the inclined surface Aa is directed toward the sample-holding surface 5 side. That is, the angle between the inclined surface Aa and the space-forming wall surface Ab is an obtuse angle. Therefore, in one or more embodiments of the present invention, one positioning member 3 is provided on each side of the main body 2, and the area of the quadrangle parallel to the sample-holding surface 5 and surrounded by the inclined surfaces Aa of all the positioning members 3 becomes smaller as it proceeds to the sample-holding surface 5. In one or more embodiments of the present invention, the inclined surface Aa is a plane and is not curved. That is, the inclined surface Aa of one positioning member 3 and the inclined surface Aa of another positioning member 3 located at a position facing the one positioning member 3 converge toward the sample-holding surface 5 side in a tapered manner.

In one or more embodiments of the present invention, part of or the entirety of the inclined surface Aa is a contact surface (contact part). That is, the contact surface (contact part) is a portion which is brought into contact with part of the semiconductor substrate 10, which is a sample, when the semiconductor substrate 10 is held or the semiconductor substrate 10 is shifted. Whether or not the semiconductor substrate 10 is brought into contact with the contact surface depends on the size or the shape of the semiconductor substrate 10, and the entirety of the inclined surface Aa is not a contact surface (contact part). However, in one or more embodiments of the present invention, since the inclined surface Aa constitutes one plane, there is no substantial benefit in defining where is the contact surface (contact part) and where is not. At least, the inclined surface Aa is a "section which is a contact part or smoothly continues to the contact part". Hereinafter, in order to avoid confusion, a description will be given assuming that the entirety of the inclined surface Aa is a contact surface (contact part).

As described above, the shape of the positioning member 3 adopted in one or more embodiments of the present invention is roughly the same as the positioning member 202 of the above-described prototype. Therefore, the following six ridges exist also in the positioning member 3 according to one or more embodiments of the present invention:
(1) a ridge Aa-Ab where the contact surface Aa and the space-forming wall surface Ab are in contact with each other;
(2) a ridge Aa-C where the contact surface Aa and the downward-facing surface C are in contact with each other;
(3) a ridge B-C where the outward-facing surface B and the downward-facing surface C are in contact with each other;
(4) two ridges A-D at each of which the inward-facing surface A and the side surface D are in contact with each other;
(5) two ridges B-D at each of which the outward-facing surface B and the side surface D are in contact with each other; and
(6) two ridges C-D at each of which the downward-facing surface C and the side surface D are in contact with each other.

Note that since the space-forming wall surface Ab and the contact surface Aa are different planes, the two ridges A-D at each of which the inward-facing surface A and each of the two side surfaces D are in contact with each other are bent. Therefore, to be exact, the ridge A-D is divided into a ridge Ab-D where the space-forming wall surface Ab and the side surface D are in contact with each other, and a ridge Aa-D where the contact surface Aa and the side surface D are in contact with each other.

In addition, there is a corner where three surfaces are in contact with one another also in the positioning member 3 according to one or more embodiments of the present invention. Also in the positioning member 3 according to one or more embodiments of the present invention, there are the following three types of corners:
(7) two corners Aa-C-D each formed by the contact surface Aa, the downward-facing surface C and each of the two side surfaces D;
(8) two corners B-C-D each formed by the outward-facing surface B, the downward-facing surface C, and each of the two side surfaces D; and
(9) two corners Aa-Ab-D each formed by the contact surface Aa, the space-forming wall surface Ab, and each of the two side surfaces D.

The above-described space-forming wall surface Ab is vertical relative to the sample-holding surface 5, and is a plane different from the inclined surface (contact surface) Aa. That is, a corner part (ridge) Aa-Ab exists between the inclined surface Aa and the space-forming wall surface Ab. However, in one or more embodiments of the present invention, the corner part Aa-Ab is rounded. In other words, the end of the contact part (inclined surface Aa) on the sample-holding surface 5 side is rounded.

In addition, the ridge Aa-C between the contact surface Aa and the downward-facing surface C is rounded. In other words, the end (ridge Aa-C) of the contact part (contact surface Aa) on the farther side from the sample-holding surface 5 is rounded.

In addition, the ridge B-C where the outward-facing surface B and the downward-facing surface C are in contact with each other is rounded. In other words, the end (ridge B-C) of the outward-facing surface B on the farther side from the sample-holding surface 5 is rounded. In yet other words, the end (ridge B-C) of the outward-facing surface B on the front-end side is rounded.

Furthermore, the two ridges A-D at each of which the inward-facing surface A and each of the two side surfaces D are in contact with each other are rounded. In other words, a corner part (ridge A-D) configured by the inward-facing surface A and the side surface D is rounded.

In addition, the two ridges B-D at each of which the outward-facing surface B and each of the side surfaces D are in contact with each other are rounded. In other words, each corner part (ridge B-D) configured by the outward-facing surface B and the side surface D is rounded.

In addition, the ridges C-D at each of which the downward-facing surface C and each of the two side surfaces D are in contact with each other are rounded. In other words, each corner part (ridge C-D) configured by the downward-facing surface C and the side surface D is rounded.

In addition, the corner Aa-C-D formed by the contact surface Aa, the downward-facing surface C, and the side surface D is rounded. In other words, a corner part (corner Aa-C-D) configured by the contact surface Aa, the downward-facing surface C, and the side surface D is rounded.

In addition, the corner B-C-D formed by the outward-facing surface B, the downward-facing surface C, and the side surface D is rounded. In other words, a corner part (corner B-C-D) configured by the outward-facing surface B, the downward-facing surface C, and the side surface D is rounded.

In addition, the corner Aa-Ab-D formed by the contact surface Aa, the space-forming wall surface Ab, and the side surface D is rounded. In other words, a crossing part (corner Aa-Ab-D) where the ridge Aa-Ab and the side surface D cross each other is rounded.

That is, the positioning member 3 adopted in one or more embodiments of the present invention is three-dimensional surrounded by different planes, and all the adjacent surfaces are smoothly connected to each other.

In addition, the positioning member 3 adopted in one or more embodiments of the present invention is three-dimensional surrounded by different planes, adjacent surfaces are connected by a rounded surface, and a joint part between surfaces is rounded.

In a case where the semiconductor substrate 10 is held and lifted by the sample-holding device 1 according to one or more embodiments of the present invention, the sample-holding device 1 is brought close to the semiconductor substrate 10 by a robot or the like, air is made to flow from a center hole 17, an air flow is formed between the semiconductor substrate 10 and the sample-holding surface 5, the pressure in the space between them is made negative, and thus the semiconductor substrate 10 is sucked toward the sample-holding surface 5 side. Here, when the sample-holding device 1 is brought close to the semiconductor substrate 10, the center of the semiconductor substrate 10 and the center of the sample-holding surface 5 may not be aligned with each other or the X-axis and the Y-axis of the semiconductor substrate 10 may not be aligned with corresponding ones of the sample-holding surface 5. However, in one or more embodiments of the present invention, since the inclined surface Aa of one positioning member 3 and the inclined surface Aa of another positioning member 3 located at a position facing the one positioning member 3 converge toward the sample-holding surface 5 side in a tapered manner, the center of the semiconductor substrate 10 and the center of the sample-holding surface 5 are gradually aligned with each other, and the X-axes and the Y-axes of them are gradually aligned with each other.

In addition, when the semiconductor substrate 10 is held by the sample-holding device 1, the semiconductor substrate 10 may hit the corner part (ridge or corner) of the positioning member 3. In one or more embodiments of the present invention, since each corner part is rounded, the semiconductor substrate 10 is not scratched. In addition, since the friction coefficient of the positioning member 3 is small, the semiconductor substrate 10 slips when the semiconductor substrate 10 hits the positioning member 3, and the semiconductor substrate 10 is damaged little.

Figure 4:
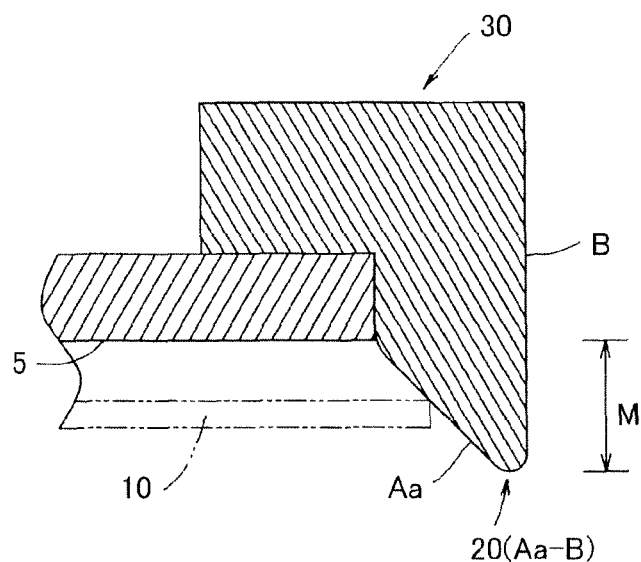
FIG. 4 is a partially enlarged cross-sectional view of a sample-holding device according to one or more embodiments of the present invention.

In the above-described embodiment, the cross-sectional shape of the effective portion M of the positioning member 3 is a pentagon as illustrated in the enlarged view in FIG. 2. However, the cross-sectional shape of the effective portion M of the positioning member 3 is not limited to this. For example, the cross-sectional shape may be a trapezoid as illustrated in FIG. 4. In a positioning member 30 illustrated in FIG. 4, an effective portion M projecting downward below a sample-holding surface 5 is surrounded by an inward-facing surface A, an outward-facing surface B facing outward (side opposite to the sample-holding surface 5), and side surfaces (not illustrated) connecting the inward-facing surface A and the outward-facing surface B. There is no downward-facing surface. An inclined surface (contact part) Aa is included in the inward-facing surface A. The end (corner part 20) of the inclined surface (contact part) Aa on the farther side from the sample-holding surface 5 is rounded. That is, a ridge Aa-B is rounded. The same constituents as those in the above-described embodiment are denoted by the same reference numerals and an overlapped description will be omitted. The same applies to the following embodiments.

Figure 5:
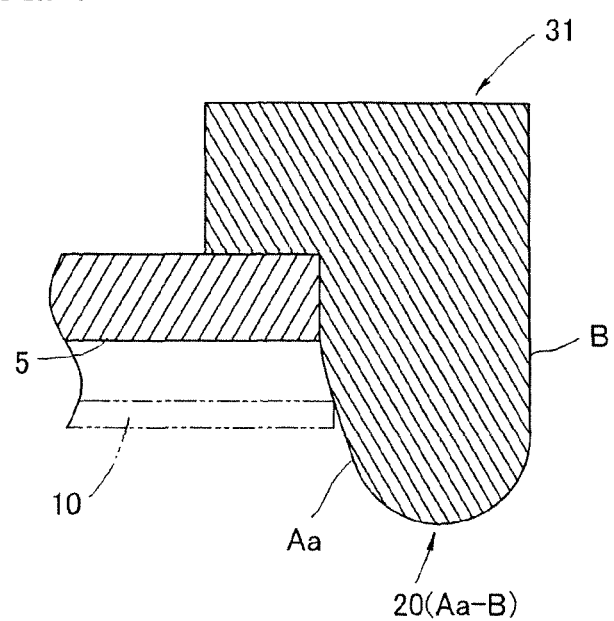
FIG. 5 is a partially enlarged cross-sectional view of a sample-holding device according to one or more embodiments of the present invention.

FIG. 5 illustrates an example where the positioning member 31 is thick and the distance between an inclined surface (contact part) A and an outward-facing surface B is great. Also in one or more embodiments of the present invention, the end (corner part 20) of the inclined surface (contact part) A on the farther side from a sample-holding surface 5 is rounded. That is, a ridge Aa-B is rounded.

Figure 6:
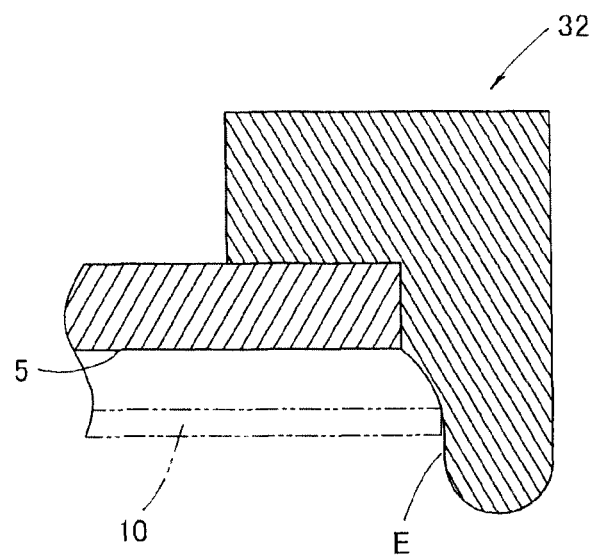
FIG. 6 is a partially enlarged cross-sectional view of a sample-holding device according to one or more embodiments of the present invention.

In addition, in each of the above-described embodiments, the contact part A is an inclined plane. However, similarly to a positioning member 32 illustrated in FIG. 6, the contact part may be an arc-shaped inclined surface E.

Figure 7:
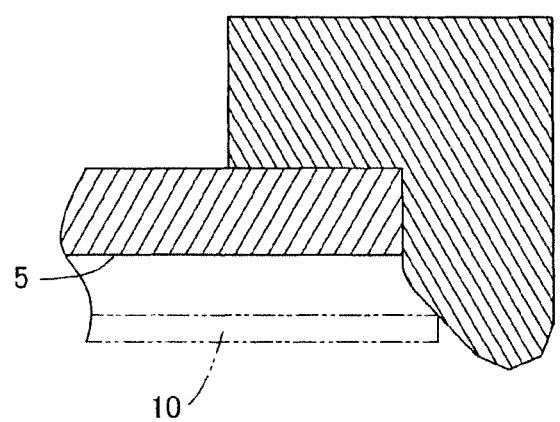
FIG. 7 is a partially enlarged cross-sectional view of a sample-holding device according to one or more embodiments of the present invention.
Figure 8:
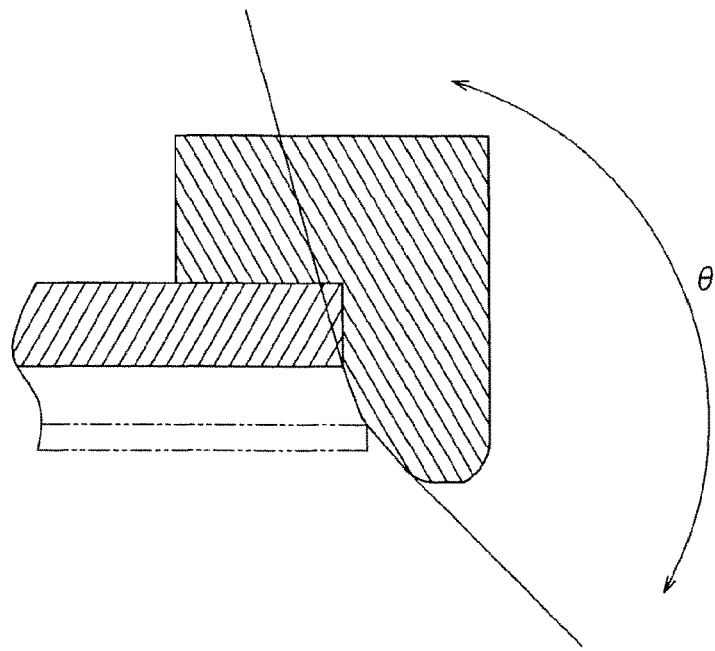
FIG. 8 is a partially enlarged cross-sectional view of a sample-holding device according to one or more embodiments of the present invention.

In addition, in each of the above-described embodiments, all the corner parts (ridges and corners) have an arc surface; however, the corner part may be formed of a polygon as illustrated in FIG. 7. In addition, the corner part may be a chamfered part as illustrated in FIG. 8. Note that in a case where the corner part has a chamfered shape in lieu of an arc surface, the angle between the adjacent surfaces needs to be an obtuse angle close to 180 degrees. For example, angle θ between the adjacent surfaces may be greater than or equal to 160 degrees.

In each of the above-described embodiments, there is no angular section at all in the effective portion M of the positioning member 3. As described, a configuration where there is no angular section at all is most recommended; however, not all the pointed ends of the corners or the like are necessarily eliminated. Priorities regarding elimination of an angular portion is as follows.

First Priority Group
(2) The ridge Aa-C where the contact surface Aa and the downward-facing surface C are in contact with each other
(3) The ridge B-C where the outward-facing surface B and the downward-facing surface C are in contact with each other That is, the first priority is to eliminate an angular portion in the "end of the section which is a contact part or smoothly continues to the contact part, on the farther side from the sample-holding surface" and the "end of an outward-facing part provided on the back side of the contact part, on the farther (more distant) side from the sample-holding surface (end of the outward-facing part)".

Second Priority Group
(7) The two corners Aa-C-D each formed by the contact surface Aa, the downward-facing surface C and the side surface D
(8) The two corners B-C-D each formed by the outward-facing surface B, the downward-facing surface C, and the side surface D That is, the second priority is to eliminate an angular portion in "the corner part that includes the downward-facing part crossing the section including the contact part and the smoothly continuing part from the contact part and extending in a direction parallel to or inclined with respect to the sample-holding surface, and the side part crossing the section including the contact part and the smoothly continuing part from the contact part and extending in a direction crossing the sample-holding surface, the corner part being configured by the downward-facing part, the side part, and the section including the contact part and the smoothly continuing part", and the "corner part that includes the outward-facing part provided on the back side of the contact part, the downward-facing part crossing the section including the contact part and the smoothly continuing part from the contact part and extending in a direction parallel to or inclined with respect to the sample-holding surface, and the side part crossing the section including the contact part and the smoothly continuing part from the contact part and extending in a direction crossing the sample-holding surface, the corner part being configured by the outward-facing part, the downward-facing part, and the side part".

Third Priority Group
(4) The two ridges A-D at each of which the inward-facing surface A and the side surface D are in contact with each other
(5) The two ridges B-D at each of which the outward-facing surface B and the side surface D are in contact with each other That is, the third priority is to eliminate an angular portion in "the corner part that includes the side part crossing the section which is a contact part or smoothly continues to the contact part and extending in the direction crossing the sample-holding surface, the corner part being configured by the side part and the section which is a contact part or smoothly continues to the contact part", and "the corner part that includes the outward-facing part provided on the back side of the contact part, and the side part crossing the section which is a contact part or smoothly continues to the contact part and extending in the direction crossing the sample-holding surface, the corner part being configured by the outward-facing part and the side part".

Next, a description will be given of a solar cell 100 which can be manufactured by a manufacturing device 1 for a solar cell according to one or more embodiments of the present invention.

Figure 9:
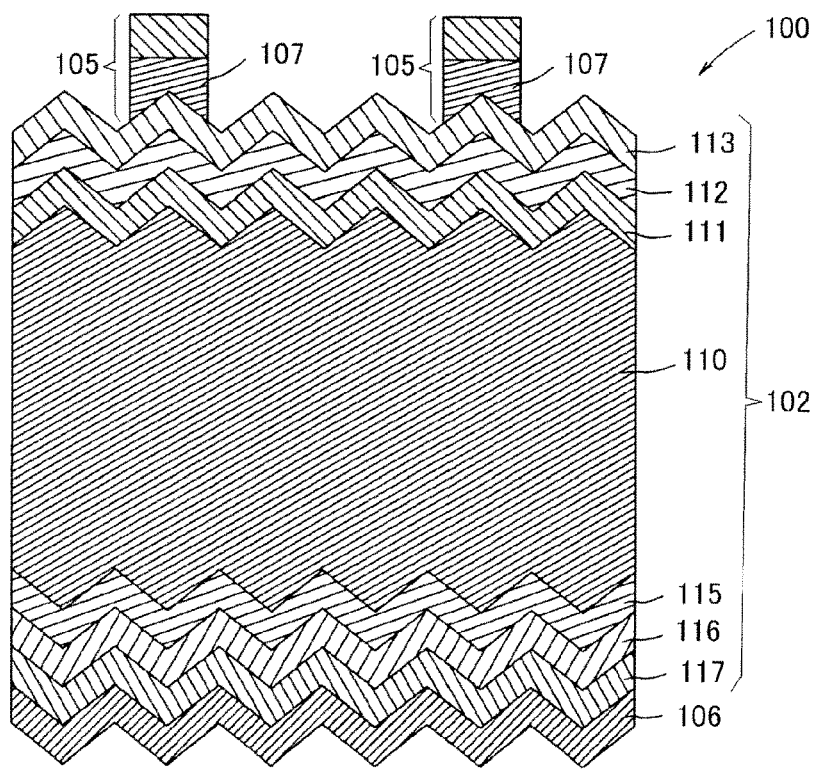
FIG. 9 is a cross-sectional view of a solar cell.

The solar cell 100 is a crystal silicon solar cell including a crystal silicon substrate as a support substrate. Specifically, the solar cell 100 is a heterojunction crystal silicon solar cell (hereinafter also referred to as "heterojunction solar cell"). As illustrated in FIG. 9, the solar cell 100 includes a collector electrode 105 on one main surface (first main surface) of a photoelectric conversion substrate 102. In addition, the solar cell 100 includes a rear-surface electrode layer 106 on the other main surface (second main surface) of the photoelectric conversion substrate 102.

The photoelectric conversion substrate 102 is a photoelectric conversion unit which can convert light energy into electrical energy, and is a plate-shaped substrate extending in a plane. The photoelectric conversion substrate 102 is formed by laminating a plurality of layers on both surfaces of a crystal silicon substrate 110, and includes a PIN junction or a PN junction as a whole. Specifically, as illustrated in FIG. 9, in the photoelectric conversion substrate 102, an i-type amorphous silicon-based thin film 111, a p-type amorphous silicon-based thin film 112, and a first transparent electrode layer 113 (transparent conductive oxide layer) are laminated on one main surface (surface on the light incident side) of the n-type single-crystal silicon substrate 110. In addition, in the photoelectric conversion substrate 102, an i-type amorphous silicon-based thin film 115, an n-type amorphous silicon-based thin film 116, and a second transparent electrode layer 117 are laminated on the other main surface (surface on the rear side) of the n-type single-crystal silicon substrate 110.

As illustrated in FIG. 9, texture structures are formed on both surfaces of the n-type single-crystal silicon substrate 110. The texture structures are reflected on the outer layers, and the texture structures are formed on both surfaces of the photoelectric conversion substrate 102 as a whole.

The n-type single-crystal silicon substrate 110 is a semiconductor substrate, and is a single-crystal silicon substrate containing an atom (for example, a phosphorus atom) for introducing an electron into a silicon atom.

The i-type amorphous silicon-based thin film 111 is a semiconductor layer, and is an intrinsic silicon layer to which an impurity such as phosphorus or boron is not added. For example, an i-type hydrogenated amorphous silicon layer made of silicon and hydrogen can be adopted.

The i-type amorphous silicon-based thin film 115 is a semiconductor layer, and is an intrinsic silicon layer to which an impurity such as phosphorus or boron is not added. For example, an i-type hydrogenated amorphous silicon layer made of silicon and hydrogen can be adopted.

The p-type amorphous silicon-based thin film 112 is a semiconductor layer, and is a silicon layer containing an atom (for example, a boron atom) for introducing a hole into a silicon atom. For example, a p-type hydrogenated amorphous silicon layer, a p-type amorphous silicon carbide layer, or a p-type amorphous silicon oxide layer can be adopted.

The n-type amorphous silicon-based thin film 116 is a semiconductor layer, and is a silicon layer containing an atom (for example, a phosphorus atom) for introducing an electron into a silicon atom. For example, an n-type amorphous silicon layer can be adopted.

The first transparent electrode layer 113 is a transparent conductive film, and is a layer having light-transmissivity and conductivity. The constituent material of the first transparent electrode layer 113 is not particularly limited as long as the constituent material has light-transmissivity and conductivity. For example, the first transparent electrode layer 113 is made of a transparent conductive oxide such as an indium tin oxide (ITO), an indium zinc oxide (IZO), a tin oxide ($SnO_2$), or a zinc oxide (ZnO). Note that the first transparent electrode layer 113 may be obtained by adding a dopant to the above-described transparent conductive oxide.

The second transparent electrode layer 117 is a transparent conductive film, and is a layer having light-transmissivity and conductivity. The second transparent electrode layer 117 is not particularly limited as long as the constituent material has light-transmissivity and conductivity. For example, the second transparent electrode layer 117 is made of a transparent conductive oxide such as an indium tin oxide (ITO), an indium zinc oxide (IZO), a tin oxide ($SnO_2$), or a zinc oxide (ZnO). Note that the second transparent electrode layer 117 may be obtained by adding a dopant to the above-described transparent conductive oxide.

Subsequently, an outline of a manufacturing method for the solar cell 100 according to the first embodiment will be described. The solar cell 100 is manufactured by using a sputtering device, a CVD device, a plating device and the like, not illustrated. The sample-holding device 1 according to one or more embodiments of the present invention is utilized when a substrate, which is a sample, is transferred between the devices. In a process not illustrated, the n-type single-crystal silicon substrate 110 on which the texture structure is formed (hereinafter referred to as a solar cell substrate 101 in-process, including the processed n-type single-crystal silicon substrate 110 and a laminate body on the n-type single-crystal silicon substrate 110) is manufactured. Then, the solar cell substrate 101 in-process is held by the sample-holding device 1 according to one or more embodiments of the present invention, and is equipped on the CVD device, not illustrated, directly or by using another transfer device in combination. That is, a substrate holding process of holding the solar cell substrate 101 in-process by the sample-holding device 1 is included in the manufacturing processes.

Figure 10A:
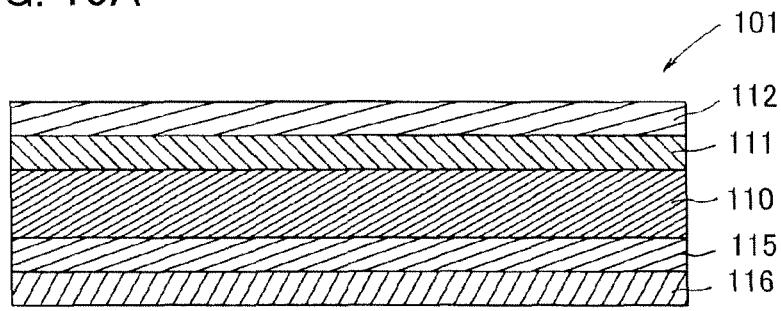

Then, as illustrated in FIG. 10A, the silicon-based thin films 111, 112, 115, and 116 are formed on the front and rear surfaces of the n-type single-crystal silicon substrate 110 by a plasma CVD method. That is, the i-type amorphous silicon-based thin film 111 and the p-type amorphous silicon-based thin film 112 are formed on one main surface of the n-type single-crystal silicon substrate 110, and the i-type amorphous silicon-based thin film 115 and the n-type amorphous silicon-based thin film 116 are formed on the other main surface (silicon layer formation process).

Figure 10B:
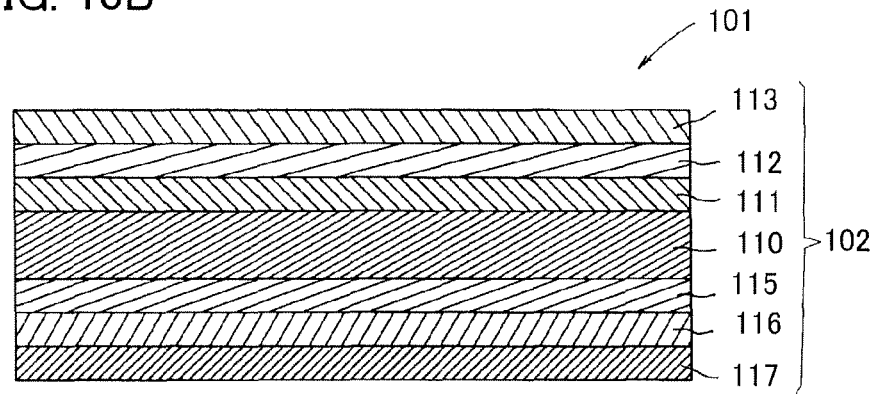

Then, when the silicon-based thin films 111, 112, 115, and 116 have been formed on the n-type single-crystal silicon substrate 110, the solar cell substrate 101 in-process is transferred to the sputtering device. Also in this case, the solar cell substrate 101 in-process is held by the sample-holding device 1 according to one or more embodiments of the present invention, and is equipped on the sputtering device, not illustrated, directly or by using another transfer device in combination. In the sputtering device, the transparent electrode layers 113 and 117 are formed on the front and rear surfaces of the solar cell substrate 101 in-process, respectively, as illustrated in FIG. 10B. That is, the first transparent electrode layer 113 is formed on the p-type amorphous silicon-based thin film 112 of the photoelectric conversion substrate 102, and the second transparent electrode layer 117 is formed on the n-type amorphous silicon-based thin film 116 of the solar cell substrate 101 in-process (transparent electrode layer formation process).

Figure 10C:
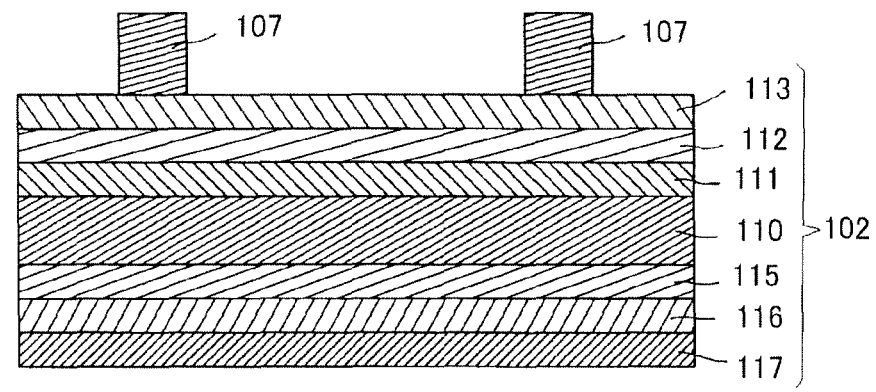

Then, the solar cell substrate 101 in-process is transferred from the sputtering device to a printing device. Also in this case, the substrate holding process of holding the solar cell substrate 101 in-process by the sample-holding device 1 according to one or more embodiments of the present invention is performed. Then, in the printing device, a base electrode layer 107 is formed by a screen printing method on the surface of the solar cell substrate 101 in-process as illustrated in FIG. 10C. Then, an insulating layer, not illustrated, is provided on the solar cell substrate 101 in-process (an opening exists on the base electrode layer), a plating layer is formed on the base electrode layer, and the collector electrode 105 is formed. Note that as the collector electrode and the rear-surface electrode layer, paste may be printed or a plating layer may be formed by a plating method. For example, as the collector electrode, a plating layer may be formed after formation of the base electrode layer 107. In that case, the holding device according to one or more embodiments of the present invention may be used since deposition of plating on a non-desired spot can be suppressed. In FIG. 9, the rear-surface electrode layer is formed on the entire rear surface; however, the rear-surface electrode layer may be patterned similarly to the collector electrode on the front surface side.

As described, the sample-holding device 1 according to one or more embodiments of the present invention is used when the solar cell substrate 101 in-process is moved; however, a sample-holding device having another structure may also be used in combination. However, it is possible to use the sample-holding device 1 according to one or more embodiments of the present invention immediately before forming the transparent electrode layers 113 and 117 by the sputtering method. Note that the transparent electrode layers 113 and 117 are not limited to those manufactured by the sputtering method. The transparent electrode layers 113 and 117 may also be formed by an ion-plating method. The collector electrode is not limited to one formed by printing and plating. The collector electrode may be formed by one of printing and plating, or may be formed by the sputtering method. The sample-holding device 1 according to one or more embodiments of the present invention may be used immediately before formation of the transparent electrode layer; however, may be used before formation of the silicon-based thin films. That is, the silicon-based thin films 111, 112, 115, and 116 are formed on the n-type single-crystal silicon substrate 110. Judging from the experience, it is possible to use the sample-holding device 1 when the solar cell substrate 101 in-process in this state is held.

In addition, it is possible to use the sample-holding device 1 according to one or more embodiments of the present invention also when the solar cell substrate 101 in-process is moved after the transparent electrode layers 113 and 117 are formed. In particular, in the heterojunction solar cell, the silicon substrate 110 and the silicon-based thin films 111, 112, 115, and 116 are generally sensitive and likely to be damaged. When the silicon substrate 110 and silicon-based thin films 111, 112, 115, and 116 are damaged, failure may occur in a case where plating or the like is applied subsequently. Therefore, it is possible to use the sample-holding device 1 according to one or more embodiments of the present invention. In addition, since the heterojunction solar cell generally includes the transparent electrode layers 113 and 117, and each of the transparent electrode layers 113 and 117 is as thin as about 10 to 140 nm, the transparent electrode layers 113 and 117 are also likely to be damaged. Due to the above-described reason, it is recommended to use the sample-holding device 1 according to one or more embodiments of the present invention also when the solar cell substrate 101 in-process is moved after the transparent electrode layers 113 and 117 are formed.

In the above-described manufacturing method, the base electrode layer 107 is provided on the first transparent electrode layer 113, and the plating layer is formed on the base electrode layer 107; however, the plating layer may be provided directly on the first transparent electrode layer 113. In addition, in one or more embodiments of the present invention, a description has been given of a mode where the collector electrode provided on the light-receiving surface side. However, the collector electrode may not be provided on the light-receiving surface side and only the back-surface electrode layer may be provided on the light-receiving surface side.

Figure 11:
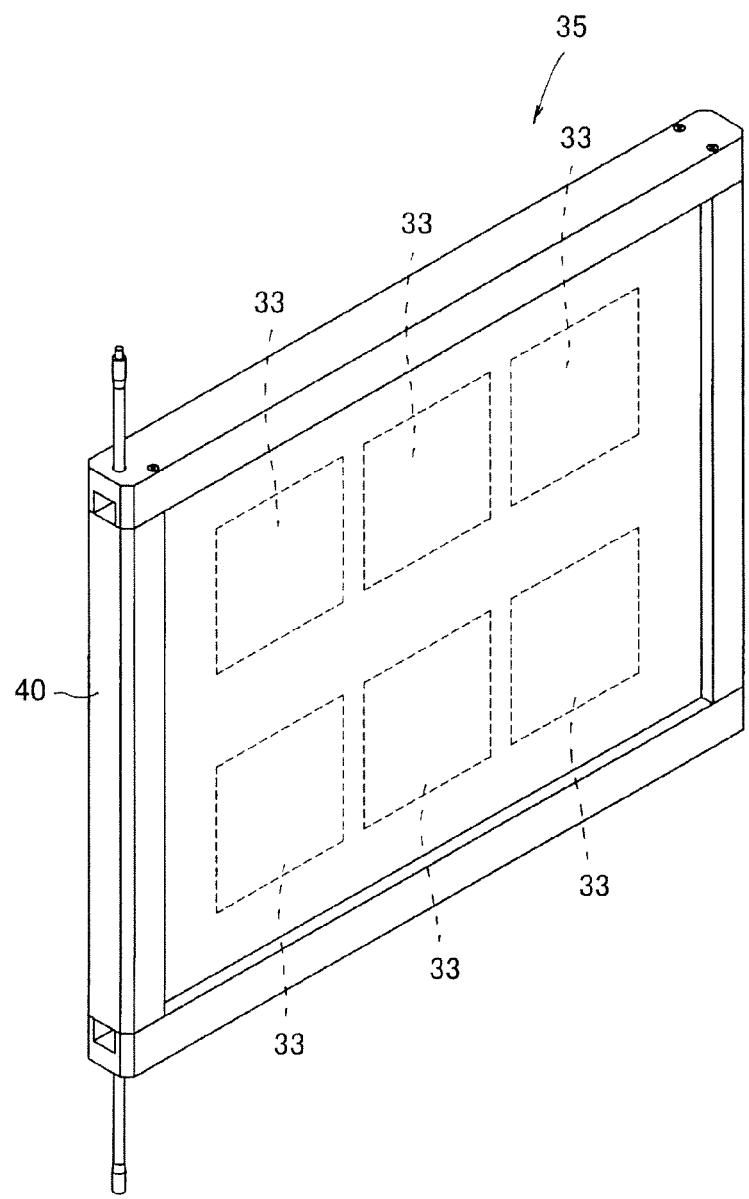
FIG. 11 is a perspective view of a solar cell module.
Figure 12:
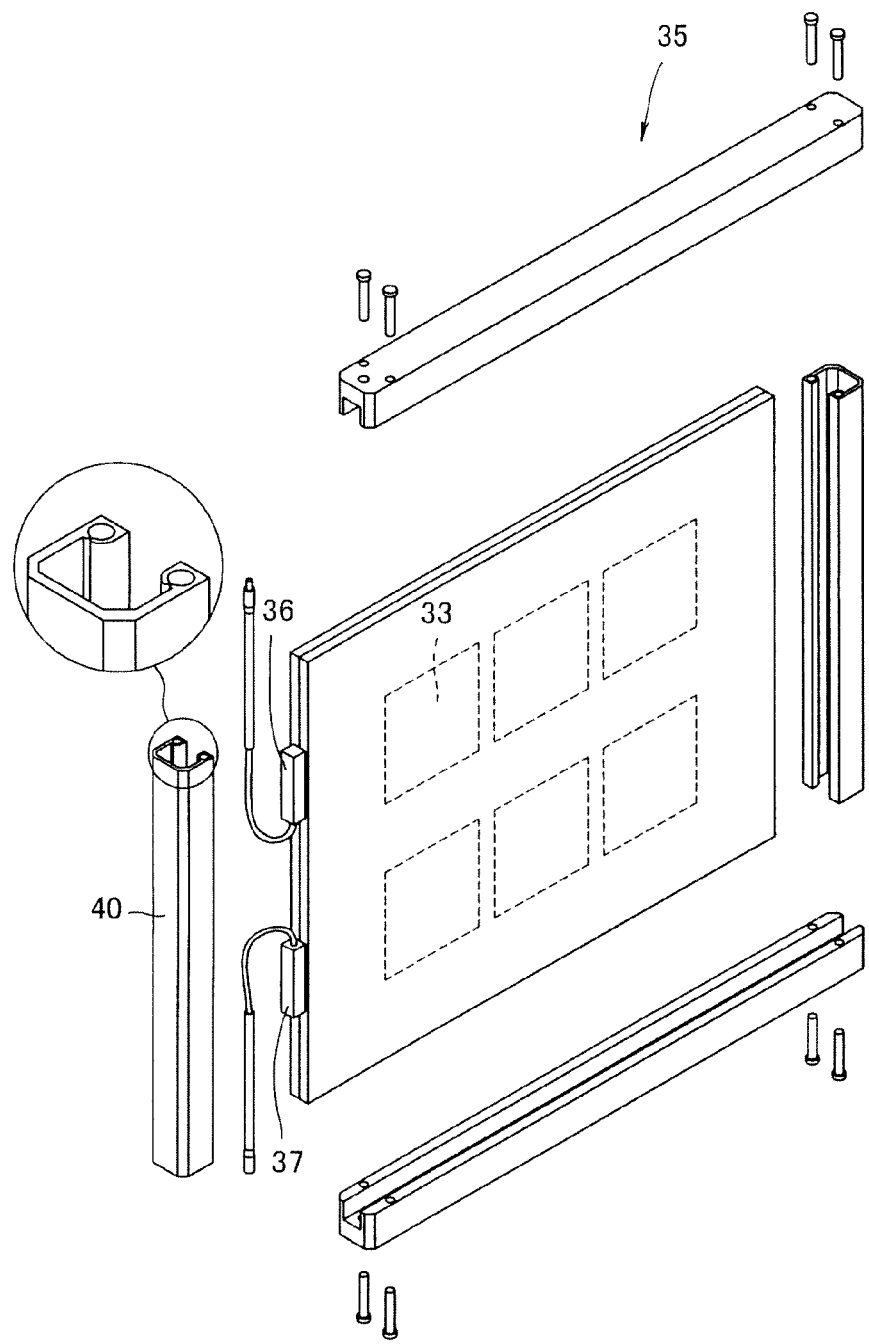
FIG. 12 is an exploded perspective view of the solar cell module illustrated in FIG. 11.
Figure 13:
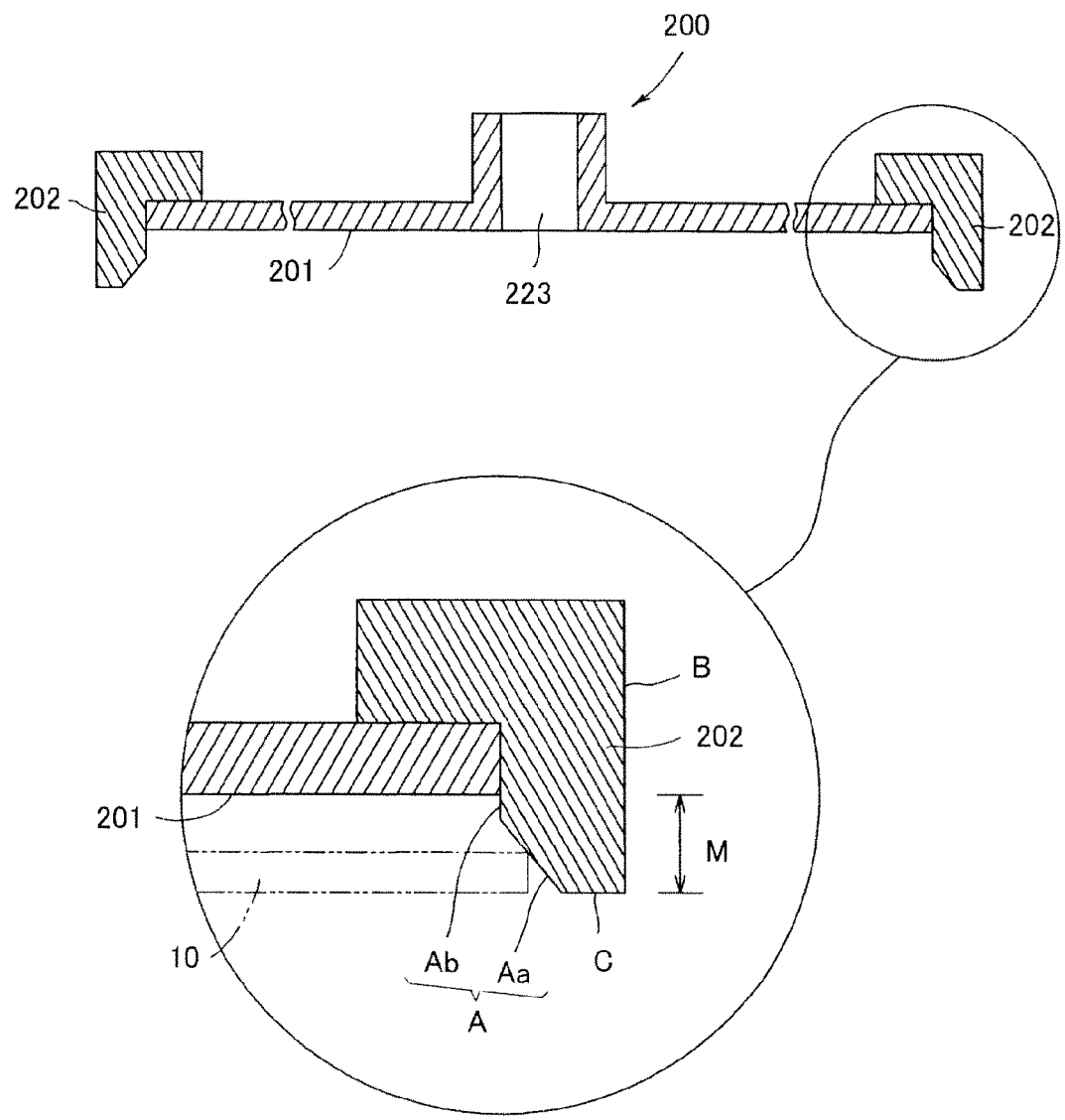
FIG. 13 is a cross-sectional view of a sample-holding device manufactured by the present inventors for comparison, and a partially enlarged view of the cross-sectional view.
Figure 14A:
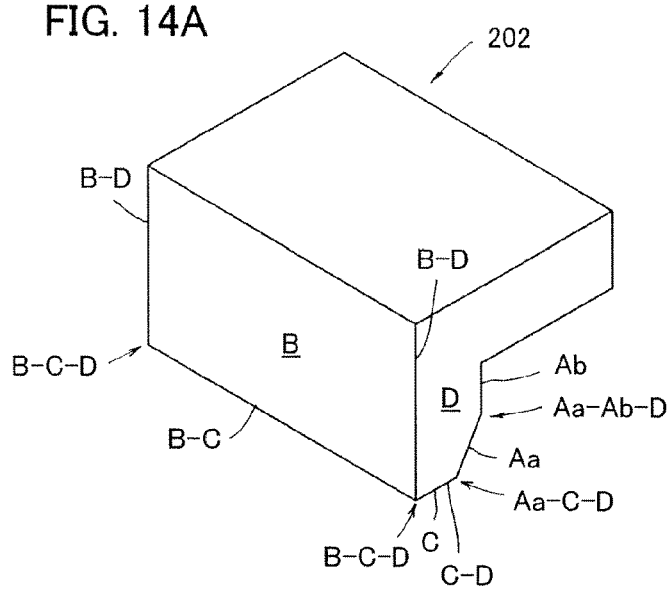
Figure 14B:
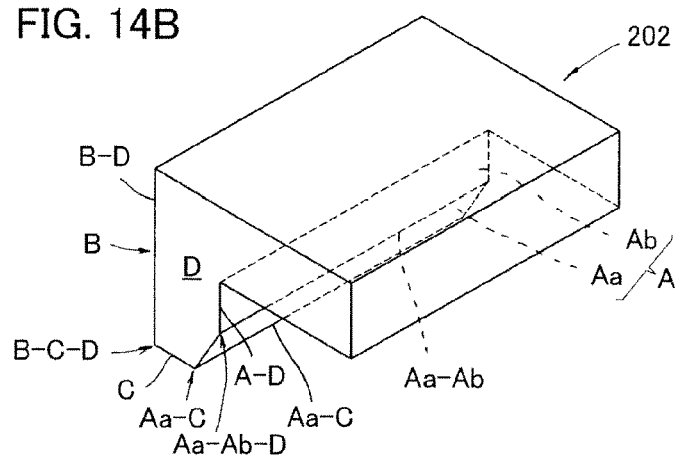
Figure 14C:
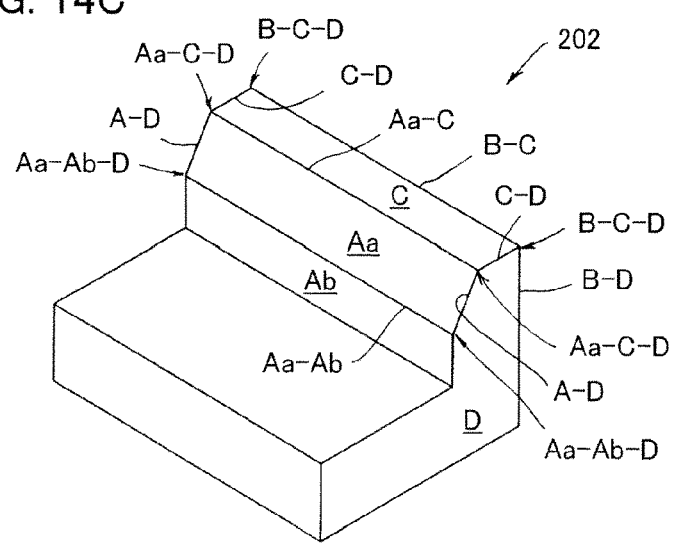
Figure 15:
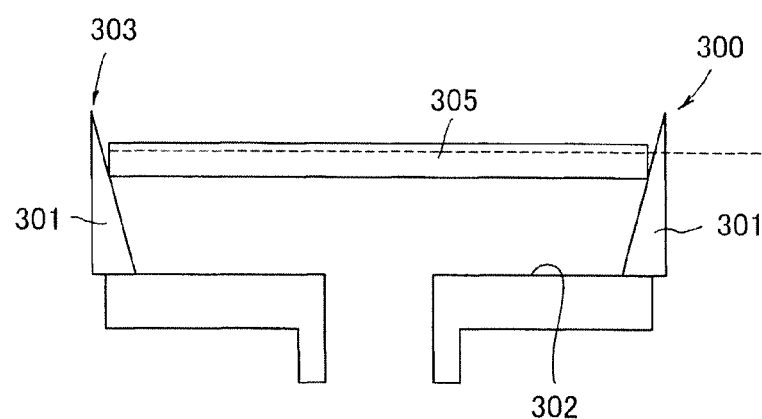
FIG. 15 is a cross-sectional view of the sample-holding device disclosed in Patent Document 1.

A separate attachment member is fitted to the solar cell manufactured by the method for manufacturing a solar cell according to one or more embodiments of the present invention, and the solar cell and the attachment member constitutes a module. FIG. 11 illustrates a solar cell module 35 in which a solar cell 33 manufactured by the method for manufacturing a solar cell according to one or more embodiments of the present invention is used. In the solar cell module 35, a plurality of solar cells (substrates) 33 are sealed between two glass plates 38 and 39 (FIG. 12). A sealing material made of resin is filled between the solar cells and each of the two glass plates 38 and 39, and the solar cells are sealed with the sealing material. Electric wires, not illustrated, are connected to each solar cell 33, and are connected to terminal boxes 36 and 37 provided at ends of the two glass plates 38 and 39. A frame 40 made of aluminum or the like is fitted on the circumference of the two glass plates 38 and 39. The configuration of the solar cell module and arrangement of each member are not limited to the embodiments.

Although the disclosure has been described with respect to only a limited number of embodiments, those skilled in the art, having benefit of this disclosure, will appreciate that various other embodiments may be devised without departing from the scope of the present invention. Accordingly, the scope of the present invention should be limited only by the attached claims.

EXPLANATION OF REFERENCE SIGNS

1: sample-holding device
2: main body
3: positioning member
5: sample-holding surface
32, 22: terminal box
35: solar cell module
A: inward-facing surface
B: outward-facing surface
C: downward-facing surface
D: side surface
Aa-Ab: ridge
Aa-C: ridge
B-C: ridge
A-D: ridge
B-D: ridge
C-D: ridge

What is claimed is:

1. A sample-holding device for holding and lifting a sample, the device comprising:
   a sample-holding surface facing the sample, the sample being a solar cell in process having a semiconductor substrate; and
   a positioning member provided at a peripheral part of the sample-holding surface, the positioning member comprising:

a contact part;
an outward-facing part on a back side of the contact part;
a section comprising the contact part or a part smoothly continuing from the contact part;
a side part crossing the section and extending in a direction crossing the sample-holding surface;
a first rounded or chamfered end;
a second rounded or chamfered end; and
a third rounded or chamfered end,
wherein the sample-holding device generates negative pressure by making a gas flow between the sample-holding surface and the sample to suck the sample toward the sample-holding surface by the negative pressure, and holds the sample at a position in proximity to the sample-holding surface,
wherein the positioning member prevents the sample from moving in a planar direction of the sample-holding surface,
wherein the contact part contacts with part of the sample when the sample is held or when the sample is off-point,
wherein the first rounded or chamfered end is an end of the section and is located distant from the sample-holding surface,
wherein the second rounded or chamfered end is an end of the outward-facing part and is located on a tipping side of the outward-facing part, and
wherein the third rounded or chamfered end is an end of the side part and the section.

2. The sample-holding device according to claim 1, wherein the positioning member is three-dimensional and has a contact surface constituting the contact part.

3. The sample-holding device according to claim 1, wherein the contact part is an inclined surface inclined toward the sample-holding surface.

4. The sample-holding device according to claim 1, wherein the contact part is made of a material with a dynamic friction coefficient of less than 0.2.

5. The sample-holding device according to claim 1, wherein the semiconductor substrate of the sample to be held is a silicon substrate having a thickness ranging from 50 μm to 200 μm.

6. The sample-holding device according to claim 1, wherein the positioning member further comprises:
a downward-facing part crossing the section and extending in a direction parallel to or inclined with respect to the sample-holding surface;
a first rounded or chamfered corner; and
a second rounded or chamfered corner,
wherein the first rounded or chamfered corner is configured by the downward-facing part, the side part, and the section, and the second rounded or chamfered corner is configured by the outward-facing part, the downward-facing part, and the side part.

7. The sample-holding device according to claim 1, wherein the positioning member further comprises:
a fourth rounded or chamfered end,
wherein the fourth rounded or chamfered end is configured by the outward-facing part and the side part.

8. A method for manufacturing a solar cell comprising a semiconductor substrate, the method comprising holding a solar cell substrate in-process using the sample-holding device according to claim 1, the solar cell substrate in-process being a solar cell in-process.

9. The method for manufacturing a solar cell according to claim 8, the method further comprising forming a transparent conductive film on the substrate after the holding.

10. A method for manufacturing a solar cell module comprising a solar cell sealed with a sealing material, wherein the solar cell is manufactured by the method according to claim 8.

11. The sample-holding device according to claim 1,
wherein the positioning member further comprises:
a downward-facing part crossing the section and extending in a direction parallel to or inclined with respect to the sample-holding surface; and
a fifth rounded or chamfered end,
and
wherein the fifth rounded or chamfered end is an end of the side part and the downward-facing part.

12. A sample-holding device for holding and lifting a sample, the device comprising:
a sample-holding surface facing the sample, the sample being a solar cell in process having a semiconductor substrate; and
a positioning member provided at a peripheral part of the sample-holding surface, the positioning member comprising:
a contact part;
an outward-facing part on a back side of the contact part;
a section comprising the contact part or a part smoothly continuing from the contact part;
a downward-facing part crossing the section and extending in a first direction parallel to or inclined with respect to the sample-holding surface; and
a side part crossing the section and extending in a second direction crossing the sample-holding surface; and
a ridge that is an end of the section, the end of the section being on a side of the sample-holding surface,
wherein the sample-holding device generates negative pressure by making a gas flow between the sample-holding surface and the sample to suck the sample toward the sample-holding surface by the negative pressure, and holds the sample at a position in proximity to the sample-holding surface,
wherein the positioning member prevents the sample from moving in a planar direction of the sample-holding surface,
wherein the contact part contacts with part of the sample when the sample is held or when the sample is off-point,
wherein the positioning member further comprises a first end, a second end, a third end, a fourth end, a fifth end, a first corner, a second corner, and a crossing part,
wherein the third end is rounded or chamfered,
wherein the ridge, the first end, the second end, the fourth end, the fifth end, the first corner, the second corner, or the crossing part is rounded or chamfered, and
wherein
the first end is an end of the section that is located distant from the sample-holding surface,
the second end is an end of the outward-facing part that is located on a tipping side of the outward-facing part,
the third end is configured by the side part and the section,
the fourth end is configured by the outward-facing part and the side part, the fifth end is configured by the downward-facing part and the side part, the first corner is configured by the downward-facing part, the side part, and the section, the second corner is configured by the outward-facing part, the downward-facing part, and the side part, and the crossing part is a part where the ridge and the side part cross each other.

13. The sample-holding device according to claim 12, wherein the positioning member is three-dimensional and has a contact surface constituting the contact part.

14. The sample-holding device according to claim 12, wherein the contact part is an inclined surface inclined toward the sample-holding surface.

15. The sample-holding device according to claim 12, wherein the contact part is made of a material with a dynamic friction coefficient of less than 0.2.

16. The sample-holding device according to claim 12, wherein the semiconductor substrate of the sample to be held is a silicon substrate having a thickness ranging from 50 µm to 200 µm.

17. A method for manufacturing a solar cell comprising a semiconductor substrate, the method comprising holding a solar cell substrate in-process using the sample-holding device according to claim 12, the solar cell substrate in-process being the solar cell in-process.

18. The method for manufacturing a solar cell according to claim 17 comprising forming a transparent conductive film on a substrate after the holding.

19. A method for manufacturing a solar cell module comprising a solar cell sealed with a sealing material, wherein the solar cell is manufactured by the method according to claim 17.

* * * * *